(12) United States Patent
Cheng et al.

(10) Patent No.: US 9,779,880 B2
(45) Date of Patent: *Oct. 3, 2017

(54) RESIN COMPOSITION AND DIELECTRIC LAYER AND CAPACITOR PRODUCED THEREFROM

(71) Applicant: 3M INNOVATIVE PROPERTIES COMPANY, St. Paul, MN (US)

(72) Inventors: Tao Cheng, Shanghai (CN); Qilin Chen, Shanghai (CN); Zhou Jin, Shanghai (CN)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/251,214

(22) Filed: Aug. 30, 2016

(65) Prior Publication Data

US 2016/0372269 A1    Dec. 22, 2016

Related U.S. Application Data

(63) Continuation of application No. 14/361,730, filed as application No. PCT/CN2011/084369 on Dec. 21, 2011, now Pat. No. 9,455,088.

(51) Int. Cl.
| | |
|---|---|
| *B32B 15/092* | (2006.01) |
| *B32B 27/20* | (2006.01) |
| *B32B 27/38* | (2006.01) |
| *H01G 4/20* | (2006.01) |
| *C08L 63/00* | (2006.01) |
| *C09D 163/00* | (2006.01) |
| *H01G 9/07* | (2006.01) |
| *H05K 1/03* | (2006.01) |
| *C08K 3/24* | (2006.01) |
| *C08K 7/08* | (2006.01) |
| *C08K 7/14* | (2006.01) |
| *H01G 9/042* | (2006.01) |
| *H01G 9/055* | (2006.01) |
| *H01G 9/15* | (2006.01) |

(52) U.S. Cl.
CPC ............. *H01G 9/07* (2013.01); *C08K 3/24* (2013.01); *C08K 7/08* (2013.01); *C08K 7/14* (2013.01); *H01G 4/203* (2013.01); *H01G 9/042* (2013.01); *H01G 9/055* (2013.01); *H01G 9/15* (2013.01); *H05K 1/0366* (2013.01); *H05K 2201/0293* (2013.01)

(58) Field of Classification Search
None
See application file for complete search history.

(56) References Cited

U.S. PATENT DOCUMENTS

| | | | |
|---|---|---|---|
| 5,162,977 A | 11/1992 | Paurus | |
| 6,274,224 B1 | 8/2001 | O'Bryan | |
| 9,455,088 B2 * | 9/2016 | Cheng | ............... H01G 4/203 |
| 2005/0003199 A1 | 1/2005 | Takaya et al. | |
| 2005/0186437 A1 | 8/2005 | Pramanik | |
| 2007/0030627 A1 | 2/2007 | Tsukada | |
| 2009/0267183 A1 | 10/2009 | Temple | |
| 2010/0060381 A1 | 3/2010 | Das | |
| 2011/0108309 A1 * | 5/2011 | Peiffer | ............... H05K 1/162 |
| | | | 174/257 |
| 2012/0008252 A1 * | 1/2012 | Yang | ............... H01B 1/24 |
| | | | 361/311 |
| 2014/0362494 A1 * | 12/2014 | Cheng | ............... H05K 1/0366 |
| | | | 361/324 |

FOREIGN PATENT DOCUMENTS

| | | |
|---|---|---|
| CN | 101973145 | 2/2011 |
| EP | 0713930 | 5/1996 |
| EP | 1407463 | 4/2004 |
| WO | WO 03-011589 | 2/2003 |
| WO | WO 2010-127245 | 11/2010 |
| WO | WO 2011-056455 | 5/2011 |
| WO | WO 2013/091197 A1 * | 6/2013 ............... H05K 1/03 |

OTHER PUBLICATIONS

International Search Report for PCT International Application No. PCT/CN2011/084369, mailed on Nov. 8, 2012.

* cited by examiner

*Primary Examiner* — Michael J Feely

(74) *Attorney, Agent, or Firm* — Clifton F. Richardson

(57) ABSTRACT

The present invention provides a resin composition comprising: 1 to 20 parts by weight of a reinforcing fiber; 0.2 to 5 parts by weight of an anti-settling agent; 20 to 40 parts by weight of an epoxy resin; 0.1 to 3 parts by weight of a curing agent; and 50 to 75 parts by weight of a high dielectric constant filler. The present invention further provides a dielectric layer produced from the resin composition and a capacitor comprising the dielectric layer. In the dielectric layer made from the resin composition provided by the present invention, the fibers can be evenly dispersed and can enhance the mechanical strength of the resin composition, and cooperate with the epoxy resin to bring excellent toughness. Therefore, the mechanical strength of the produced dielectric layer can be remarkably improved, and its fragility can be effectively overcome when the dielectric layer is used in the PCB double-side etching process.

16 Claims, No Drawings

RESIN COMPOSITION AND DIELECTRIC LAYER AND CAPACITOR PRODUCED THEREFROM

TECHNICAL FIELD

The present invention generally relates to the field of materials capable of being used to manufacture electronic products, and specifically, relates to a resin composition. Furthermore, the present invention relates to a dielectric layer and a capacitor respectively made from the resin composition.

BACKGROUND OF THE INVENTION

With the trend towards high functionalization and miniaturization of electronic devices, the passive devices in the electronic systems have increasingly predominated. At present, a majority of passive devices are present in the form of a discrete element surface mounted on a circuit board substrate and occupy about 80% by area of the circuit board substrate surface, for example, the passive devices are 20 times as many as the active devices in a cellular phone. The surface mounted passive devices also require many interconnections and welded dots on a surface of the substrate so that the electric properties and reliability of the materials and system are greatly declined.

In order to provide an electronic system which has lower price, lighter weight, better properties and higher reliability, it is effective to convert the previous surface-mounted passive devices into the embedded passive devices. By using a multilayered printed circuit board (PCB) technology, the embedded passive devices are produced by including passive devices in the layers of the substrate, which are capable of saving the area of the surface while reducing impedance and improving reliability and electric properties. Therefore, the embedded passive devices have potential of solving the above problems.

Among all of passive devices, the capacitor has particularly attracted attention due to the high number of surface capacitors typically used in a device. The embedded capacitor can contribute to the reduction of size of a final product comprising the capacitor and the improvement of properties of the product.

U.S. Pat. No. 5,162,977 discloses a dielectric material which has a dielectric constant 10 times higher than that of epoxy resin and is produced by impregnating glass fiber fabric with an epoxy resin and ceramic powders. However, the capacitance density of the dielectric material is not sufficiently high, mainly because the glass fiber fabric itself has low dielectric constant and the thickness of the dielectric layer can not be easily controlled by this impregnation process so that its capacitance density fluctuated greatly.

WO 03/011589 discloses a thin capacitor which has a three-layer structure, that is, thermoset resin layer, heat-resistant thin film layer and thermoset resin layer, and possesses excellent mechanical strength capable of satisfying PCB double-side etching process requirement. However, the heat-resistant thin film in the thin capacitor contains excessive halogen and cannot satisfy the halogen-free requirement of the current electronic products.

WO 2010/127245 A2 discloses a thin dielectric material reinforced with a liquid crystal polymer nonwoven fabric, which can achieve relatively high capacitance density and mechanical strength, but the liquid crystal polymer nonwoven fabric cannot be stably supplied and has a prohibitive price which is not acceptable for common customers.

Therefore, there is a need to develop a dielectric material which possesses relatively high capacitance density and mechanical strength meanwhile meets the halogen-free requirement for electronic products, consequently this dielectric material can be used to manufacture capacitors and other electronic products.

SUMMARY OF THE INVENTION

In order to develop such desired dielectric material, the inventors of the present invention have made in-depth study. The inventors find that such desired dielectric material can be obtained by purposefully selecting the types and amounts of its components contained therein.

Therefore, according to one aspect of the present invention, a resin composition is disclosed and comprises:
 1 to 20 parts by weight of a reinforcing fiber;
 0.2 to 5 parts by weight of an anti-settling agent;
 20 to 40 parts by weight of an epoxy resin;
 0.1 to 3 parts by weight of a curing agent; and
 50 to 75 parts by weight of a high dielectric constant filler.

Commonly, such a resin composition is in the solid state, e.g. a resin composition powder.

Optionally, the resin composition further comprises a solvent, and thus a resin composition solution is attained.

Furthermore, the composition solution may be cured, typically in the form of a film or sheet.

According to another aspect of the present invention, a dielectric layer is disclosed and comprises the uncured or cured resin composition in the form of a film or sheet as described above.

According to yet another aspect of the present invention, a method of producing a dielectric layer is disclosed and comprises the steps of:
 providing a conductive substrate;
 coating the resin composition solution as described above on the conductive substrate and curing it.

According to yet another aspect of the present invention, a capacitor is disclosed and comprises a first conductive substrate and a second conductive substrate, wherein one of the first conductive substrate and the second conductive substrate [has the dielectric layer as described above on one surface thereof and said two conductive substrates are bound to each other with the dielectric layer being sandwiched therebetween.

According to yet another aspect of the present invention, a capacitor is disclosed and comprises a first conductive substrate and a second conductive substrate, wherein both the first conductive substrate and the second conductive substrate have the dielectric layer as described above on one surface thereof and said two conductive substrates are bound to each other with the two dielectric layers positioned oppositely.

In the dielectric layer produced from the resin composition according to the present invention, the fibers can enhance the mechanical strength of the dielectric layer and form a superior synergistic effect when being mixed with the epoxy resin. Therefore, the mechanical strength of the produced dielectric layer can be remarkably improved, and the fragility of the dielectric layer can also be effectively overcome such that it can be sued in PCB double-side etching process.

DETAILED DESCRIPTION OF THE INVENTION

In the present invention, the term "capacitance density" means the capacitance per square centimeter ($nf/cm^2$) of a capacitor, unless otherwise specifically indicated.

According to some embodiments of the present invention, the resin composition comprises:

1 to 20 parts by weight of a reinforcing fiber;
0.2 to 5 parts by weight of an anti-settling agent;
20 to 40 parts by weight of an epoxy resin;
0.1 to 3 parts by weight of a curing agent; and
50 to 75 parts by weight of a high dielectric constant filler.

According to some embodiments of the present invention, fibers are added into the resin composition to enhance the mechanical strength such as tearing strength or the like of the composition. In the present invention, the term "reinforcing fiber" in the present invention means a fiber material for enhancing the mechanical strength of the resin composition, unless otherwise specifically indicated. The reinforcing fiber is selected from one or more of glass fibers, carbon fibers, organic polymer short cut fibers and inorganic whiskers or the like. The reinforcing fiber has preferably a diameter of 0.1 to 10 μm and a length of 5 μm to 3 mm. More preferably, the reinforcing fiber has a diameter of 0.1 to 10 μm and a length of 10 to 400 μm. Even more preferably, the reinforcing fiber is alkali-free glass fiber powders and/or potassium titanate whiskers having a diameter of 0.1 to 10 μm and a length of 10 to 400 μm. When the reinforcing fiber has the diameter and length in the above ranges, the resulting resin composition has excellent mechanical strength. The alkali-free glass fiber powders and potassium titanate whiskers are preferably used because they possess superior mechanical strength, heat resistance, electric insulation, chemical resistance and compatibility with epoxy resin, have submicron scale dimensions of length <400 μm and diameter <10 μm and are relatively suitable to produce a thin embedded capacitor. The resin composition comprises 1 to 20 parts by weight, preferably 1 to 15 parts by weight and more preferably 1 to 12 parts by weight of the reinforcing fiber.

The preferable commercial products of the reinforcing fiber include: alkali-free glass fiber powders (diameter of 9 μm; length of 10-200 μm) from Hangzhou Gaoke Composite Material Co., Ltd.; potassium titanate whiskers (diameter of 0.5-1 μm; length of 10-50 μm) from Shenyang Jinjian Short cut Fiber Composite Material Co., Ltd.

According to some embodiments of the present invention, the anti-settling agent for use in the present invention is mainly used to prevent the settlement of the reinforcing fibers and can not have any negative influence on the properties of the resin composition. Since the fumed silica is rich in hydroxyl groups on a surface thereof and the hydroxyl groups have strong adsorption to the surfaces of the reinforcing fibers, consequently the reinforcing fibers trend to locally generate some support for each other so that the settlement of the reinforcing fibers can be well prevented. In addition, the fumed silica will not have negative influence on the properties of the resin composition. In order to ensure superior compatibility of fumed silica with epoxy resin, dispersibility and the anti-settling effect, the fumed silica which has a specific surface density of 120 to 250 $g/m^2$, preferably 150 to 200 $g/m^2$ and has been subjected to hydrophobic surface treatment is preferable. The preferable commercial products of the fumed silica include: fumed silica HB-620 from Guangzhou Jibisheng Technology Co., Ltd.

According to some embodiments of the present invention, the epoxy resin in the resin composition provides good mechanical strength, which is particularly beneficial when the resulting composition is used for the dielectric layer in a capacitor. In addition, the epoxy resin can cooperate with the above reinforcing fibers to provide a superior synergistic effect for reinforcing the composition. According to the present invention, the type and structure (for example, molecular weight or the like) of the epoxy resin are not particularly limited, as long as it can reinforce the mechanical strength of the composition and cooperate with the reinforcing fibers to provide synergistic effect. The epoxy resin is selected from one or more of bisphenol-A epoxy resin, bisphenol-F epoxy resin, bisphenol-S epoxy resin, phenolic novolac epoxy resin, o-cresol novolac epoxy resin and the like. The bisphenol-A epoxy resin with an epoxy equivalent of 1000 to 3000 g/eq is preferably used due to its relatively good toughness and acceptable heat resistance range. Further, o-cresol novolac epoxy resin can achieve excellent overall properties by using it in combination with the bisphenol-A epoxy resin due to its superior heat resistance and low water adsorption rate. The preferable commercial products of the epoxy resin include: epoxy resin GT6097 from Huntsman Advanced Materials (Guangdong) Co., Ltd.

According to some embodiments of the present invention, a curing agent is added into the resin composition to cure it so as to achieve desired strength. The curing agent is preferably a latent amine type curing agent. More preferably, the latent amine type curing agent is selected from one or more of dicyandiamide, 4,4'-diaminodiphenylsulfone, 4,4'-diaminodiphenylether, 4,4'-diaminodiphenylmethane, 2-methylimidazole, 2-ethyl-4-methyl-imidazole, 2-phenylimidazole, a terminal tertiary amine group-containing hyperbranched polyester and the like. Dicyandiamide is preferably used due to its excellent operation window, good toughness of the cured product and high peeling strength.

According to some embodiments of the present invention, in order to impart the resulting resin composition with relatively high capacitance density so as to satisfy the requirements for the electronic products, the high dielectric constant filler is used to produce the resin composition. In the present invention, the term "high dielectric constant filler" means a filler having a dielectric constant generally greater than 100 capable of being used in the dielectric layer of the capacitor, unless otherwise specifically indicated. The high dielectric constant filler is selected from one or more of barium titanate, strontium titanate, barium strontium titanate, calcium barium titanate, calcium lead titanate ceramic, lead titanate-lead magnesium niobate, carbon black, carbon nanotubes, metals and metal oxides or the like. The high dielectric constant fillers as described above are generally in the form of powders. The particle diameter of the high dielectric constant filler in the form of powders is not particularly limited, as long as the high dielectric constant filler can be evenly dispersed in the resulting final resin composition. Barium titanate is preferably used due to its high dielectric constant, stable electrical property and suitability for producing embedded capacitor. Further, since it is desirable that the particle diameter of the filler is not too large in the process of producing a thin embedded capacitor (with a dielectric layer thinner than 50 μm), barium titanate having a diameter in the range of 0.1 to 2 μm is preferably used.

According to some embodiments of the present invention, the resin composition further contains 30 to 70 parts by weight of an organic solvent. The type of the organic solvent is not particularly limited, as long as the organic solvent is capable of effectively dissolving and/or dispersing various components as described above. Preferably, the specific examples of the organic solvent include methyl ethyl ketone, methyl isobutyl ketone or ethylene glycol monomethyl ether.

In addition, some aids such as a levelling agent, a dispersant or a diluent may be added into the resin composition to improve the properties of process and product.

According to another aspect of the present invention, the present invention provides a dielectric layer comprising the cured resin composition as described in some embodiments, wherein the dielectric layer has a thickness of 1 to 50 µm. It can be understood that the cured resin composition contained in the dielectric layer does not comprise or only comprises a small amount of the organic solvent as the organic solvent is a medium material that typically evaporates during the curing process.

Further aspect of the present invention provides a capacitor including a first conductive substrate and a second conductive substrate, wherein one of the first conductive substrate and the second conductive substrate has the dielectric layer as described above on one surface thereof and said two conductive substrates are bound to each other via the dielectric layer. In certain examples of the present invention, the first conductive substrate and the second conductive substrate are metal foils and preferably electrodeposited copper foils. In order to ensure that the short circuit of the dielectric layer in the capacitor does not occur under high voltage, the electrodeposited copper foil having a roughness Rz less than 5 µm (JIC C 6515) is preferable. In the capacitor of the present invention, the thickness of the dielectric layer after laminating is preferably 1 to 50 µm.

Still another aspect of the present invention provides a capacitor including a first conductive substrate and a second conductive substrate, wherein both the first conductive substrate and the second conductive substrate have the dielectric layer as described above on one surface thereof and said two conductive substrates are bound to each other via the two dielectric layers. According to certain examples of the present invention, the first conductive substrate and the second conductive substrate are metal foils and preferably electrodeposited copper foils. In order to ensure that the short circuit of the dielectric layer in the capacitor does not occur under high voltage, the electrodeposited copper foil having a roughness Rz less than 5 µm (JIC C 6515) is preferable. In the capacitor of the present invention, the thickness of the dielectric layers after laminating is preferably 1 to 50 µm.

Hereinafter, the processes of producing the resin composition, dielectric layer and capacitor according to the present invention are specifically described.

The process of producing the resin composition is exemplified as below, but not limited thereto: predetermined amounts of a high dielectric constant filler and a reinforcing fiber are added to an organic solvent and the mixture is sheared at high speed until it is evenly dispersed; fumed silica is further added thereto and the mixture is sheared at high speed until it is evenly dispersed; and an epoxy resin and a curing agent having dissolved in an organic solvent are finally added and the mixture is evenly stirred so as to obtain the solution of the resin composition. Due to the introduction of fumed silica, the reinforcing fibers will not be settled after being evenly dispersed in the solution so as to ensure that the subsequent processes can be successfully performed. Therefore, the evenness of the reinforcing fibers in the dielectric layer can be ensured so as to sufficiently reinforce the dielectric layer.

The processes of producing the dielectric layer and the capacitor comprising the dielectric layer are exemplified as below, but not limited thereto: the solution of the resin composition is coated on an electrodeposited copper foil by hand or by a mechanical coating device; the electrodeposited copper foil coated with the solution of the resin composition is then dried by heating at 100 to 200° C. and for 3 to 10 minutes such that the resin composition is in the semi-cured state, with the result that the dielectric layer in the final laminate of the dielectric layer and the electrodeposited copper foil has a thickness of 1 to 50 µm.

Next, one piece of the laminate comprising the dielectric layer and the electrodeposited copper foil and another piece of electrodeposited copper foil without a dielectric layer are thermally bound to each other with the dielectric layer sandwiched between the two electrodeposited copper foils by heat rollers at a laminating temperature of 100 to 200° C., a laminating pressure of 1 to 8 Kgf/cm$^2$ and a laminating rate of 0.5 to 1.5 m/min. After completing the laminating, the bound product is placed into an oven at a temperature between 160° C. to 190° C. and post-cured for about 2 hours so that the capacitor is well prepared, wherein the thickness of the dielectric layer is 1 to 50 µm.

Alternatively, two laminates comprising the dielectric layer and the electrodeposited copper foil are thermally bound to each other with the two dielectric layers facing each other by heat rollers at a laminating temperature of 100 to 200° C., a laminating pressure of 1 to 8 Kgf/cm$^2$ and a laminating rate of 0.5 to 1.5 m/min. After completing the laminating, the bound product is placed into an oven at 160 to 190° C. and post-cured for about 2 h so as to produce the capacitor where the thickness of the dielectric layer is 1 to 50 µm.

Testing Methods:

The capacitor samples produced in the following examples and a comparative example respectively are tested and evaluated in terms of glass transition temperature, solder float resistance, mechanical strength (initial tearing strength), capacitance density and compatibility with the PCB double-side etching process.

The testing methods for the above characteristics are as follows:

1. Glass Transition Temperature

Areas of both electrodeposited copper foils of the capacitor are etched away with an acidic copper chloride solution and the glass transition temperature of the remained dielectric layer is measured by a differential scanning calorimeter (TA Q100) according to the DSC method as provided in IPC-TM-650 2.4.25.

2. Solder Float Resistance

The capacitor is cut into a specimen having a size of 50 mm×50 mm with a cutter and the specimen is placed into a tin bath at 288° C. to be tested according to the thermal stress testing method of the laminate as provided in IPC-TM-650 2.4.13. The duration of no delamination or blistering is recorded.

3. Initial Tearing Strength

Areas of both copper foils of the capacitor are etched away with an acidic copper chloride etching solution so that the dielectric layer is exposed. Thereafter, a specimen having a specified size is fabricated according to the specimen requirements of IPC-TM-650 2.4.16 and the initial tearing strength of the remaining dielectric layer is then determined on a material testing machine (Instron 3343) according to the provided testing procedure of IPC-TM-650 2.4.16.

4. Capacitance Density

The capacitance C and the area A of the square capacitor are determined to obtain the capacitance density (C/A). A square capacitor having a size of 5 inch×5 inch is obtained with a cutter and the capacitance C thereof is determined with a LCR meter (Agilent 4285A). The capacitance C is divided by the area A so as to obtain the capacitance density.

5. Compatibility With PCB Double-Side Etching Process

Dry film photoresist layers are applied to both electrodeposited copper foils of the capacitor of 16 inch×20 inch, and the negative image of the circuit pattern of the capacitor is formed in the photoresist layer by exposure to light and developing. Then the portions of the copper layers exposed by the patterned photoresist are etched away. After the patterned photoresist is removed, the patterned circuit in each copper layer and the expose areas of the underlying dielectric layer remain. The dielectric layer is observed with naked eye so as to determine whether it is broken (i.e. cracked) or not. The results obtained by the observation are shown in Table 1, wherein the symbol "○" represents no breakage, the symbol "Δ" represents slight breakage and the symbol "□" represents severe breakage.

EXAMPLES

The following raw materials were used for experiments in the examples of present invention.

Raw Materials:

Reinforcing fiber: potassium titanate whiskers (diameter: 0.5-1 μm; length 10-50 μm), Shenyang Jinjian Short cut Fiber Composite Material Co., Ltd.

Alkali-free glass fiber powders (diameter: 9 μm; length 10-200 μm), Hangzhou Gaoke Composite Material Co., Ltd.

Anti-settling agent: fumed silica, HB-620, Guangzhou Jibisheng Technology Co., Ltd.

Dispersant: Solsperse 76500, Lubrizol Specialty Chemicals (Shanghai) Co., Ltd.

Epoxy resin: GT6097, Huntsman Advanced Materials (Guangdong) Co., Ltd.

Curing agent: electronic-grade dicyandiamide, Ningxia Darong Chemical Metallurgy Co., Ltd.

Terminal tertiary amine group-containing hyperbranched polyester, QNP1 4135, Shanghai Wujing Chemical Engineering Science and Technology Co., Ltd.

High dielectric constant filler: barium titanate BT-101s, Shanghai Dianyang Co., Ltd.

Methyl ethyl ketone: chemical pure grade, Shanghai Xiangxun Fine Chemical Reagent Co., Ltd.

Example 1

A resin composition comprising 1 part by weight of potassium titanate whiskers, 0.3 part by weight of fumed silica HB-620, 35 parts by weight of epoxy resin GT6097, 0.3 part by weight of dicyandiamide and 63.4 parts by weight of barium titanate is prepared. Specifically, 634 g of barium titanate BT-101s and 10 g of potassium titanate whiskers were added into 360 g of Methyl ethyl ketone and the resulting mixture was sheared at high speed until it was evenly dispersed; 3 g of fumed silica HB-620 was further added thereto and the mixture was sheared at high speed until it was evenly dispersed; and 350 g of epoxy resin GT6097 and 3 g of dicyandiamide dissolved in 125 g of Methyl ethyl ketone were finally added and the mixture was evenly stirred so as to obtain 1485 g of a potassium titanate whiskers-reinforced epoxy resin composition solution.

The resulting solution was coated on a copper foil (CF-TGFB-DSTF-THE-18μ, Suzhou Fukuda Metal Co. Ltd.) by a Mayer bar; the copper foil coated with the solution was then dried by heating at 150° C. for about 3 minutes until it was in a semi-cured state, thereby a laminate of the dielectric layer and the copper foil was obtained. The dielectric layer in the laminate of the dielectric layer and the electrodeposited copper foil had a thickness of 25 μm as determined by a micrometer.

Next, the dielectric layers of two laminates of the dielectric layer and the electrodeposited copper foil were thermally bound to each other by heat rollers at a laminating temperature of 180° C., a laminating pressure of 5 Kgf/cm$^2$ and a laminating rate of 1 m/min. After completing the laminating, the bound product was placed into an oven at 160° C. and cured for about 2 hours so as to produce an embedded capacitor. The thickness of the dielectric layer in the embedded capacitor was 50 μm.

Example 2

A resin composition comprising 3 parts by weight of potassium titanate whiskers, 1 part by weight of fumed silica HB-620, 34 parts by weight of epoxy resin GT6097, 0.3 part by weight of dicyandiamide and 61.7 parts by weight of barium titanate was prepared. Specifically, 617 g of barium titanate BT-101s and 30 g of potassium titanate whiskers were added into 360 g of Methyl ethyl ketone and the resulting mixture was sheared at high speed until it was evenly dispersed; 10 g of fumed silica HB-620 was further added thereto and the mixture was sheared at high speed until it was evenly dispersed; and 340 g of epoxy resin GT6097 and 3 g of dicyandiamide dissolved in 120 g of Methyl ethyl ketone were finally added and the mixture was evenly stirred so as to obtain 1480 g of a potassium titanate whiskers-reinforced epoxy resin composition solution.

The resulting solution was coated on a copper foil (CF-TGFB-DSTF-THE-18μ, Suzhou Fukuda Metal Co. Ltd.) by a Mayer bar; the copper foil coated with the solution was then dried by heating at 150° C. for 3 min until it became a semi-cured state, thereby obtaining a laminate of the dielectric layer and the copper foil. The dielectric layer in the laminate of the dielectric layer and the electrodeposited copper foil had a thickness of 25 μm as determined by a micrometer.

Next, the dielectric layers of two laminates of the dielectric layer and the electrodeposited copper foil were thermally bound to each other by heat rollers at a laminating temperature of 180° C., a laminating pressure of 5 Kgf/cm$^2$ and a laminating rate of 1 m/min. After completing the laminating, the bound product was placed into an oven at 160° C. and cured for about 2 hours so as to produce an embedded capacitor. The thickness of the dielectric layer in the embedded capacitor was 50 μm.

Example 3

A resin composition comprising 3 parts by weight of potassium titanate whiskers, 1 part by weight of fumed silica HB-620, 34 parts by weight of epoxy resin GT6097, 0.3 part by weight of dicyandiamide and 61.7 parts by weight of barium titanate was prepared. Specifically, 617 g of barium titanate BT-101s and 30 g of potassium titanate whiskers were added into 360 g of Methyl ethyl ketone and the resulting mixture was sheared at high speed until it was evenly dispersed; 10 g of fumed silica HB-620 was further added thereto and the mixture was sheared at high speed until it was evenly dispersed; and 340 g of epoxy resin GT6097 and 3 g of dicyandiamide dissolved in 120 g of Methyl ethyl ketone were finally added and the mixture was evenly stirred so as to obtain 1480 g of a potassium titanate whiskers-reinforced epoxy resin composition solution.

The resulting solution was coated on a copper foil (CF-TGFB-DSTF-THE-18μ, Suzhou Fukuda Metal Co. Ltd.) by a Mayer bar; the copper foil coated with the solution was then dried by heating at 150° C. for 3 min until it became a semi-cured state, thereby obtaining a laminate of the dielectric layer and the copper foil. The dielectric layer in the laminate of the dielectric layer and the electrodeposited copper foil had a thickness of 50 μm as determined by a micrometer.

Next, the laminate of the dielectric layer and the electrodeposited copper foil and an electrodeposited copper foil without a dielectric layer were thermally bound to each other by heat rollers at a laminating temperature of 180° C., a laminating pressure of 5 Kgf/cm² and a laminating rate of 1 m/min with the dielectric layer sandwiched between the two electrodeposited copper foils. After completing the laminating, the bound product was placed into an oven at 160° C. and cured for about 2 hours so as to produce an embedded capacitor. The thickness of the dielectric layer in the embedded capacitor was 50 μm.

Example 4

A resin composition comprising 6 parts by weight of potassium titanate whiskers, 2 parts by weight of fumed silica HB-620, 32 parts by weight of epoxy resin GT6097, 0.3 part by weight of dicyandiamide and 59.7 parts by weight of barium titanate was prepared. Specifically, 10 g of dispersant Solsperse 76500 was added into 360 g of Methyl ethyl ketone and stirred until complete dissolution, and then 597 g of barium titanate BT-101s and 60 g of potassium titanate whiskers were added thereto and the resulting mixture was sheared at high speed until it was evenly dispersed; 20 g of fumed silica HB-620 was further added thereto and the mixture was sheared at high speed until it was evenly dispersed; and 320 g of epoxy resin GT6097 and 3 g of dicyandiamide dissolved in 112 g of Methyl ethyl ketone were finally added and the mixture was evenly stirred so as to obtain 1482 g of a potassium titanate whiskers-reinforced epoxy resin composition solution.

The resulting solution was coated on a copper foil (CF-TGFB-DSTF-THE-18μ, Suzhou Fukuda Metal Co. Ltd.) by a Mayer bar; the copper foil coated with the solution was then dried by heating at 150° C. for 3 min until it became a semi-cured state, thereby obtaining a laminate of the dielectric layer and the copper foil. The dielectric layer in the laminate of the dielectric layer and the electrodeposited copper foil had a thickness of 25 μm as determined by a micrometer.

Next, the dielectric layers of two laminates of the dielectric layer and the electrodeposited copper foil were thermally bound to each other by heat rollers at a laminating temperature of 180° C., a laminating pressure of 5 Kgf/cm² and a laminating rate of 1 m/min. After completing the laminating, the bound product was placed into an oven at 160° C. and cured for 2 h so as to produce an embedded capacitor. The thickness of the dielectric layer in the embedded capacitor was 50 μm.

Example 5

A resin composition comprising 9 parts by weight of potassium titanate whiskers, 3 parts by weight of fumed silica HB-620, 29 parts by weight of epoxy resin GT6097, 1 part by weight of curing agent QNP1 4135 and 58.7 parts by weight of barium titanate was prepared. Specifically, 10 g of dispersant Solsperse 76500 was added into 360 g of Methyl ethyl ketone and stirred until complete dissolution, and then 587 g of barium titanate BT-101s and 90 g of potassium titanate whiskers were added thereto and the resulting mixture was sheared at high speed until it was evenly dispersed; 30 g of fumed silica HB-620 was further added thereto and the mixture was sheared at high speed until it was evenly dispersed; and 290 g of epoxy resin GT6097 and 10 g of curing agent QNP1 4135 dissolved in 100 g of Methyl ethyl ketone were finally added and the mixture was evenly stirred so as to obtain 1477 g of a potassium titanate whiskers-reinforced epoxy resin composition solution.

The resulting solution was coated on a copper foil (CF-TGFB-DSTF-THE-18μ, Suzhou Fukuda Metal Co. Ltd.) by a Mayer bar; the copper foil coated with the solution was then dried by heating at 150° C. for 3 min until it became a semi-cured state, thereby obtaining a laminate of the dielectric layer and the copper foil. The dielectric layer in the laminate of the dielectric layer and the electrodeposited copper foil had a thickness of 25 μm as determined by a micrometer.

Next, the dielectric layers of two laminates of the dielectric layer and the electrodeposited copper foil were thermally bound to each other by heat rollers at a laminating temperature of 180° C., a laminating pressure of 5 Kgf/cm² and a laminating rate of 1 m/min. After completing the laminating, the bound product was placed into an oven at 160° C. and cured for 2 h so as to produce an embedded capacitor. The thickness of the dielectric layer in the embedded capacitor was 50 μm.

Example 6

A resin composition comprising 9 parts by weight of alkali-free glass fiber powders, 3 parts by weight of fumed silica HB-620, 29 parts by weight of epoxy resin GT6097, 1 part by weight of curing agent QNP1 4135 and 58.7 parts by weight of barium titanate was prepared. Specifically, 10 g of dispersant Solsperse 76500 was added into 360 g of Methyl ethyl ketone and stirred until complete dissolution, and then 587 g of barium titanate BT-101s and 90 g of alkali-free glass fiber powders were added thereto and the resulting mixture was sheared at high speed until it was evenly dispersed; 30 g of fumed silica HB-620 was further added thereto and the mixture was sheared at high speed until it was evenly dispersed; and 290 g of epoxy resin GT6097 and 10 g of curing agent QNP1 4135 dissolved in 100 g of Methyl ethyl ketone were finally added and the mixture was evenly stirred so as to obtain 1477 g of an alkali-free glass fiber powders-reinforced epoxy resin composition solution.

The resulting solution was coated on a copper foil (CF-TGFB-DSTF-THE-18μ, Suzhou Fukuda Metal Co. Ltd.) by a Mayer bar; the copper foil coated with the solution was then dried by heating at 150° C. for 3 min until it became a semi-cured state, thereby obtaining a laminate of the dielectric layer and the copper foil. The dielectric layer in the laminate of the dielectric layer and the electrodeposited copper foil had a thickness of 25 μm as determined by a micrometer.

Next, the dielectric layers of two laminates of the dielectric layer and the electrodeposited copper foil were thermally bound to each other by heat rollers at a laminating temperature of 180° C., a laminating pressure of 5 Kgf/cm² and a laminating rate of 1 m/min. After completing the laminating, the bound product was placed into an oven at 160° C. and cured for 2 h so as to produce an embedded capacitor. The thickness of the dielectric layer in the embedded capacitor was 50 µm.

Example 7

A resin composition comprising 20 parts by weight of potassium titanate whiskers, 5 parts by weight of fumed silica HB-620, 20 parts by weight of epoxy resin GT6097, 0.2 part by weight of dicyandiamide and 54.8 parts by weight of barium titanate was prepared. Specifically, 548 g of barium titanate BT-101s and 200 g of potassium titanate whiskers were added into 360 g of Methyl ethyl ketone and the resulting mixture was sheared at high speed until it was evenly dispersed; 50 g of fumed silica HB-620 was further added thereto and the mixture was sheared at high speed until it was evenly dispersed; and 200 g of epoxy resin GT6097 and 2 g of dicyandiamide dissolved in 75 g of Methyl ethyl ketone were finally added and the mixture was evenly stirred so as to obtain 1435 g of a potassium titanate whiskers-reinforced epoxy resin composition solution.

The resulting solution was coated on a copper foil (CF-TGFB-DSTF-THE-18µ, Suzhou Fukuda Metal Co. Ltd.) by a Mayer bar; the copper foil coated with the solution was then dried by heating at 150° C. for 3 min until it became a semi-cured state, thereby obtaining a laminate of the dielectric layer and the copper foil. The dielectric layer in the laminate of the dielectric layer and the electrodeposited copper foil had a thickness of 25 µm as determined by a micrometer.

Next, the dielectric layers of two laminates of the dielectric layer and the electrodeposited copper foil were thermally bound to each other by heat rollers at a laminating temperature of 180° C., a laminating pressure of 5 Kgf/cm$^2$ and a laminating rate of 1 m/min. After completing the laminating, the bound product was placed into an oven at 160° C. and cured for 2 h so as to produce an embedded capacitor. The thickness of the dielectric layer in the embedded capacitor was 50 µm.

Comparative Example A

A resin composition comprising 36 parts by weight of epoxy resin GT6097, 0.3 part by weight of dicyandiamide and 63.7 parts by weight of barium titanate was prepared. Specifically, 637 g of barium titanate BT-101s was added to 360 g of Methyl ethyl ketone and the resulting mixture was sheared at high speed until it was evenly dispersed; and 320 g of epoxy resin GT6097 and 3 g of dicyandiamide dissolved in 112 g of Methyl ethyl ketone were finally added and the mixture was evenly stirred so as to obtain 1472 g of an epoxy resin composition solution.

The resulting solution was coated on a copper foil (CF-TGFB-DSTF-THE-18µ, Suzhou Fukuda Metal Co. Ltd.) by a Mayer bar; the copper foil coated with the solution was then dried by heating at 150° C. for 3 min until it became a semi-cured state, thereby obtaining a laminate of the dielectric layer and the copper foil. The dielectric layer in the laminate of the dielectric layer and the electrodeposited copper foil had a thickness of 25 µm as determined by a micrometer.

Next, the dielectric layers of two laminates of the dielectric layer and the electrodeposited copper foil were thermally bound to each other by heat rollers at a laminating temperature of 180° C., a laminating pressure of 5 Kgf/cm$^2$ and a laminating rate of 1 m/min. After completing the laminating, the bound product was placed into an oven at 160° C. and cured for about 2 hours so as to produce an embedded capacitor. The thickness of the dielectric layer in the embedded capacitor was 50 µm.

The embedded capacitors obtained in the examples 1-7 and comparative example A were tested in terms of glass transition temperature, solder float resistance, mechanical strength (initial tearing strength), capacitance density and compatibility with PCB double-side etching process according to the testing methods described in the present invention. The testing results are shown in Table 1.

TABLE 1

|  | Example 1 | Example 2 | Example 3 | Example 4 | Example 5 | Example 6 | Example 7 | Comparative example A |
|---|---|---|---|---|---|---|---|---|
| glass transition temperature(Tg), ° C. | 115 | 115 | 115 | 117 | 117 | 120 | 123 | 115 |
| Solder float resistance, 288° C. | >5 min. | >5 min. | >5 min. | >5 min. | >5 min. | >5 min. | >5 min. | >5 min. |
| initial tearing strength, g (thickness of medium was 50 µm) | 110 | 140 | 140 | 150 | 180 | 200 | 110 | 100 |
| capacitance density, nf/in$^2$ | 2.4 | 2.4 | 2.4 | 2.4 | 2.3 | 2.3 | 2.3 | 2.4 |
| compatibility with PCB double-side etching process | Δ | Δ | Δ | Δ | ○ | ○ | Δ | □ |

As shown from data in Table 1, with the help of the reinforcing fibers, the tearing strength of the dielectric layer is greatly improved and increased with increased loading of the reinforcing fibers, but would decrease to a certain extent with further increased loading of the reinforcing fibers, mainly because the reinforcing fibers are not sufficiently contacted with the epoxy resin at the interface with further increased loading. The tearing strengths of the most preferable examples 5 and 6 of the present invention are almost 2 times higher than that of comparative example A, which indicates that the introduction of a certain amount of reinforcing fibers can markedly improve the tearing strength of the dielectric layer of the embedded capacitor and cooperate with the epoxy resin having excellent toughness to provide outstanding synergistic effect. Therefore, the fragility of the thin material in the actual PCB double-side etching process can be effectively avoided while maintaining the relatively high capacitance density and remarkable heat resistance.

What is claimed is:

1. A dielectric layer comprising a cured product of a resin composition, the resin composition comprising components:
   a) 1 to 20 parts by weight of a reinforcing fiber;
   b) 0.2 to 5 parts by weight of an anti-settling agent;
   c) 50 to 75 parts by weight of a high dielectric constant filler;
   d) 0.1 to 3 parts by weight of a curing agent; and
   e) 20 to 40 parts by weight of an epoxy resin,
wherein a combined weight of components a) to e) equals 100 parts by weight.

2. The dielectric layer of claim 1, wherein the high dielectric constant filler is barium titanate having a diameter in a range of 0.1 to 2 μm.

3. The dielectric layer of claim 1, wherein the reinforcing fiber is one or more of alkali-free glass fiber powders and potassium titanate whiskers and has a diameter of 0.1 to 10 μm and a length of 10 to 400 μm.

4. A capacitor laminate comprising a dielectric layer disposed between first and second conductive substrates, wherein the dielectric layer comprises a cured product of a resin composition, the resin composition comprising components:
   a) 1 to 20 parts by weight of a reinforcing fiber;
   b) 0.2 to 5 parts by weight of an anti-settling agent;
   c) 50 to 75 parts by weight of a high dielectric constant filler;
   d) 0.1 to 3 parts by weight of a curing agent; and
   e) 20 to 40 parts by weight of an epoxy resin,
wherein a combined weight of components a) to e) equals 100 parts by weight.

5. The capacitor laminate of claim 4, wherein at least one of the first and second conductive substrates comprises a metal foil.

6. The capacitor laminate of claim 5, wherein the metal foil is an electrolytic copper foil.

7. The capacitor laminate of claim 6, wherein the electrolytic copper foil has a roughness Rz less than 5 μm.

8. The capacitor laminate of claim 4, wherein the dielectric layer has a total thickness of 1 to 50 μm.

9. The capacitor laminate of claim 4, wherein the reinforcing fiber is selected from one or more of glass fibers, carbon fibers, organic polymer short cut fibers and inorganic whiskers.

10. The capacitor laminate of claim 4, wherein the reinforcing fiber has a diameter of 0.1 to 10 μm and a length of 5 μm to 3 mm.

11. The capacitor laminate of claim 4, wherein the reinforcing fiber is one or more of alkali-free glass fiber powders and potassium titanate whiskers and has a diameter of 0.1 to 10 μm and a length of 10 to 400 μm.

12. The capacitor laminate of claim 4, wherein the anti-settling agent comprises fumed silica, and wherein the fumed silica has a specific surface density of 120 to 250 $g/m^2$ and has been surface-treated with a hydrophobic agent.

13. The capacitor laminate of claim 4, wherein the epoxy resin comprises one or more of bisphenol-A epoxy resin, bisphenol-F epoxy resin, bisphenol-S epoxy resin, phenolic novolac epoxy resin and o-cresol novolac epoxy resin.

14. The capacitor laminate of claim 13, wherein the high dielectric constant filler is selected from one or more of barium titanate, strontium titanate, barium strontium titanate, calcium barium titanate, calcium lead titanate ceramic, lead titanate-lead magnesium niobate, carbon black, carbon nanotubes, metals and metal oxides.

15. The capacitor laminate of claim 4, prepared by: coating a surface of the first conductive substrate with the resin composition; drying the coating; laminating the second conductive substrate to the first conductive substrate, such that the first and second conductive substrates are thermally bound to each other with the coating being sandwiched there between; and curing the coating.

16. The capacitor laminate of claim 4, prepared by: coating a surface of the first conductive substrate with the resin composition; coating a surface of the second conductive substrate with the resin composition; drying the coatings; laminating the second conductive substrate to the first conductive substrate, such that the first and second conductive substrates are thermally bound to each other with the coatings being sandwiched there between; and curing the coatings.

* * * * *